United States Patent [19]
Moriwaki

[11] Patent Number: 5,717,326
[45] Date of Patent: Feb. 10, 1998

[54] FLAT CURRENT SENSOR

[76] Inventor: Ikuo Moriwaki, Blk 19, St. Thomas Walk, Grange Heights #02-21, Singapore, Singapore, 239697

[21] Appl. No.: 606,002

[22] Filed: Feb. 12, 1996

[30] Foreign Application Priority Data

Mar. 31, 1995 [JP] Japan ................................ 7-109883

[51] Int. Cl.$^6$ ............................................. G01R 15/06
[52] U.S. Cl. ........................... 324/117 H; 324/117 R; 324/126
[58] Field of Search ..................... 324/117 H, 117 R, 324/126, 127, 235

[56] References Cited

U.S. PATENT DOCUMENTS

| | | | |
|---|---|---|---|
| 3,323,056 | 5/1967 | Haley | 99/323.12 |
| 3,323,057 | 5/1967 | Haley | 324/117 R |
| 4,559,495 | 12/1985 | Lienhard | 324/117 R |
| 4,596,950 | 6/1986 | Lienhard | 324/117 R |
| 4,639,665 | 1/1987 | Gary | 324/117 H |
| 4,682,101 | 7/1987 | Cattaneo | 324/117 H |
| 4,916,392 | 4/1990 | Sendeff | 324/235 |
| 4,947,108 | 8/1990 | Gudel | 324/117 H |
| 5,124,642 | 6/1992 | Marx | 324/127 |
| 5,345,169 | 9/1994 | Etter | 324/117 R |
| 5,451,865 | 9/1995 | Coburn | 324/127 |
| 5,459,395 | 10/1995 | Berkcan | 324/127 |
| 5,473,244 | 12/1995 | Libove et al. | 324/126 |

*Primary Examiner*—Vinh P. Nguyen
*Assistant Examiner*—Anh Phung
*Attorney, Agent, or Firm*—Terrance L. Siemens

[57] ABSTRACT

A portable current measuring apparatus brings many current sensing devices close to a wire in order for the magnetic flux of the current within the wire to induce a current in the devices. The devices are arranged in a bridge circuit and connected with a signal source and a differential amplifier so that when the output of the devices is added by the amplifier the noise generated by magnetic sources is eliminated. The housing for the apparatus is small and light weight and includes a place for a portion of the current carrying wire to be positioned for current detection. Use of the apparatus does not require that the wire be cut, nor is it required that the apparatus become a permanent fixture of the circuit having the current carrying wire.

7 Claims, 3 Drawing Sheets

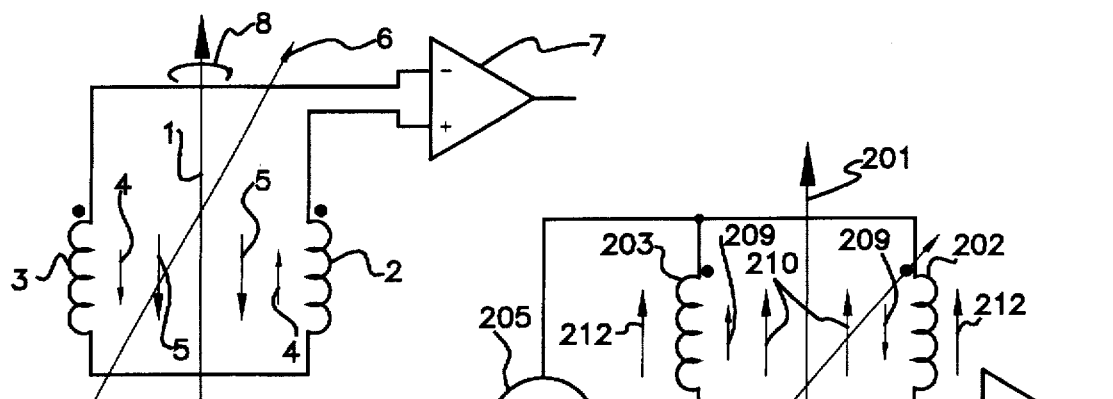
FIG. 1
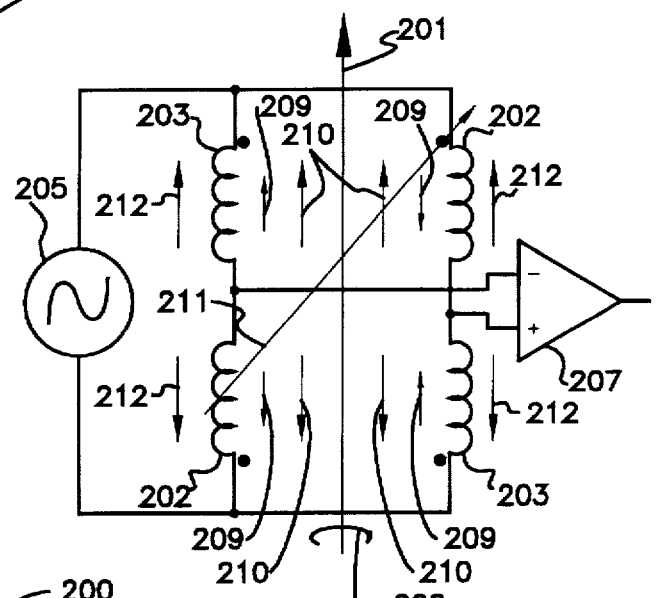
FIG. 2
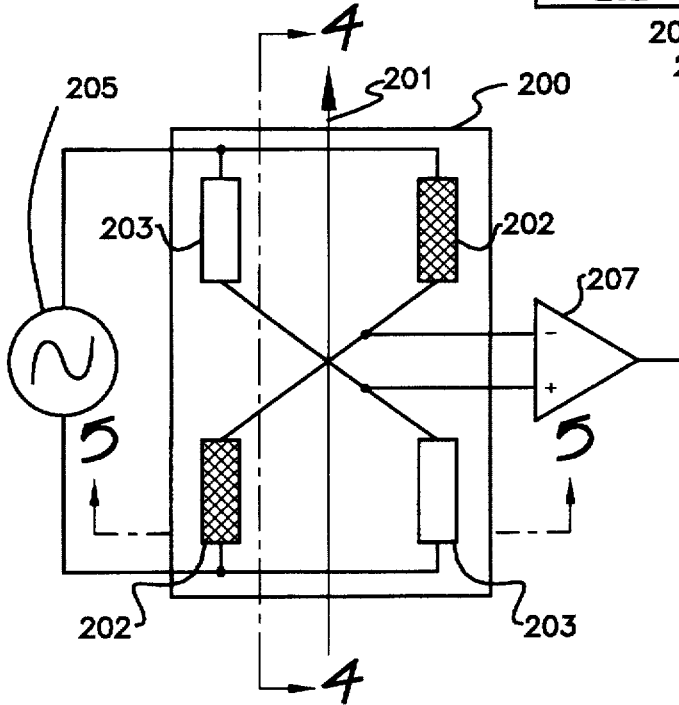
FIG. 3
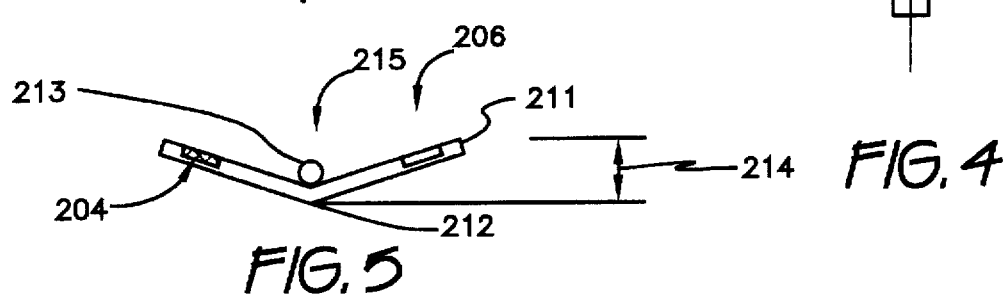
FIG. 4
FIG. 5

FLAT CURRENT SENSOR

BACKGROUND OF THE INVENTION

1. Field of the Invention

This invention relates generally to current sensors and more particularly to the field of portable sensors including coreless windings in a circuit arrangement for the detection of current within a wire. The sensor does not require the wire to be cut or to be gone through in order to detect the current carried therein.

2. Description of the Prior Art

Presently, there are several popular devices for measuring current in a line including use of current transformers, shunt resistors, Hall effect devices and current motors. The applications of these devices include placement in power monitor control systems. Oftentimes it is required that the wire be cut and a direct connection between the core of the wire and the inputs of the power monitor system be facilitated. By this method, damage to the integrity of the wire is inevitable. Furthermore, such systems add steps to the detection of current in different locations throughout the system. As a result, several methods of portable current detection have been proposed.

U.S. Pat. No. 5,124,642, issued to Marx on Jun. 23, 1992, discloses a power line current sensor having an insulated housing that places a current sensor on opposite sides of the current carrying line. The power sensors comprise coil windings positioned axially opposite a conductor wire. Current passing through the wire generates a magnetic flux. Change in the magnetic flux induces a proportional voltage in the coils. Because the coils straddle the line, the change in flux also generates a current within the coils which is in opposite directions. Circuitry is provided to add the induced current, thereby eliminating extraneous noises. Finally, an alternate embodiment is disclosed wherein two coils, of like winding directions are placed on a side of the wire. The intent of the latter configuration is to better proximate the current within the wire. The Marx apparatus is not portable because it must be fixed in place by a fixture mechanism. By contrast, the instant invention is hand held and not fixed in place.

U.S. Pat. Nos. 3,323,056 and 3,323,057, issued to Haley on May 30, 1967, disclose a method and apparatus for measuring large currents (i.e. in the order of thousands or hundreds of thousands of amperes) using an arrangement that takes advantage of the Hall Effect. The Hall Effect refers to a solid state core element which produces a voltage whose magnitude is directly proportional to flux density within the core. The core density is directly proportional to the current flowing through a subject source. In practice, the solid state core saturates at low current magnitudes. Therefore, to compensate, Haley incorporates the use of an opposing flux core and a displaced winding to detect large currents. The Haley apparatus is not portable due to its size and its detection of large currents. By contrast, the instant invention concentrates on the detection of low currents and is lightweight and portable.

U.S. Pat. No. 5,451,865, issued to Coburn on Sep. 19, 1995, discloses a method and apparatus for sensing input current using a bridge circuit. The Coburn invention is intended to become a fixture of the system and integrally includes a fixture assembly. Therefore, the Coburn apparatus is not portable. By contrast, the instant invention does not become a permanent fixture of a system thereby allowing use of the instant invention in applications that may not be suitable for a permanent fixture type current sensor.

U.S. Pat. No. 5,345,169, issued to Etter on Sep. 6, 1994, discloses an apparatus and method for measuring current using current transformers composed of windings about a core. U.S. Pat. No. 4,682,101, issued to Cattaneo on Jul. 21, 1987, discloses an apparatus and method for measuring AC and DC current using a current transformer having a core and windings around the core. By contrast, the instant invention uses coreless windings for detecting current.

U.S. Pat. No. 4,559,495, issued to Lienhard on Dec. 17, 1985, discloses an apparatus and method for contact less, coreless measurement of current as induced in a magnetic strip by displacing two current sensors on either side of the magnetic strip. Use of opposing current sensors eliminates extraneous noises. By contrast, the instant invention uses a different sensor element—coreless windings—in the current detection process.

U.S. Pat. No. 5,459,395, issued to Berkcan on Oct. 17, 1995, discloses an apparatus and method for measuring current by the placement of a first sensor for measuring changes in magnetic flux from current in a first region and a second sensor for measuring changes in magnetic flux from the current in a second region. The difference in current between the first and second sensors is measured, by the sensors, and a current source is provided for generating current to make up for the difference in current between the first and second regions. By contrast, the instant invention takes a single reading for measuring current.

It will be noted that all the cited references do not disclose a current sensing device that is portable and does not require the sensing element to become a fixture of the system whose current is to be measured. Furthermore, none of the above inventions and patents, taken either singularly or in accommodation, is seen to describe the instant invention as claimed and herein described.

SUMMARY OF THE INVENTION

Briefly, the present invention comprises a portable current measuring apparatus bringing many current sensing devices close to a .wire in order for the change in the magnetic flux of the current within the wire to induce a current within the devices. The devices are arranged in a bridge circuit and connected with a signal source and a differential amplifier so that when the difference in output of the devices is amplified, by the amplifier, the noise generated by surrounding magnetic sources is eliminated. The housing for the apparatus is small and light weight and includes a place for a portion of the current carrying wire to be positioned for current detection. Use of the apparatus does not require the current carrying wire be cut, nor is it required that the apparatus become a permanent fixture of the circuit having the current carrying wire.

Accordingly, it is a principal object of the present invention provide a current measuring apparatus and method that is portable, easy to use, and not require cutting of the current carrying wire.

It is a major object of the present invention to provide a current measuring apparatus and method for substantial elimination of electrical and magnetic noise.

It is another object of the present invention to provide a current measuring apparatus that can determine the width of a current carrying wire and insulation.

It is another object of the present invention to provide a current measuring apparatus and method that can detect both AC and DC currents.

It is another object of the present invention to provide a current measuring apparatus and method that can measure the current in a wire without generating extraneous heat.

Finally, it is a general object of the invention to provide improved elements and arrangements thereof in an apparatus for the purposes described which is inexpensive, dependable and fully effective in accomplishing its intended purposes.

These and other objects of the present invention will be readily apparent upon further review of the following specification and drawings.

BRIEF DESCRIPTION OF THE DRAWINGS

FIG. 1 depicts a basic schematic representation of an embodiment of the present invention.

FIG. 2 depicts an electrical schematic of a second embodiment of the present invention using a bridge circuit arrangement which includes a plurality of sensing devices.

FIG. 3 depicts a diagrammatic plan view of the second embodiment of the present invention.

FIG. 4 depicts a diagrammatic side elevational view along line 4—4 of FIG. 3 of the present invention.

FIG. 5 depicts a diagrammatic end elevational view along line 5—5 of FIG. 3 of the present invention.

DETAILED DESCRIPTION OF THE DRAWINGS

Figure 6:
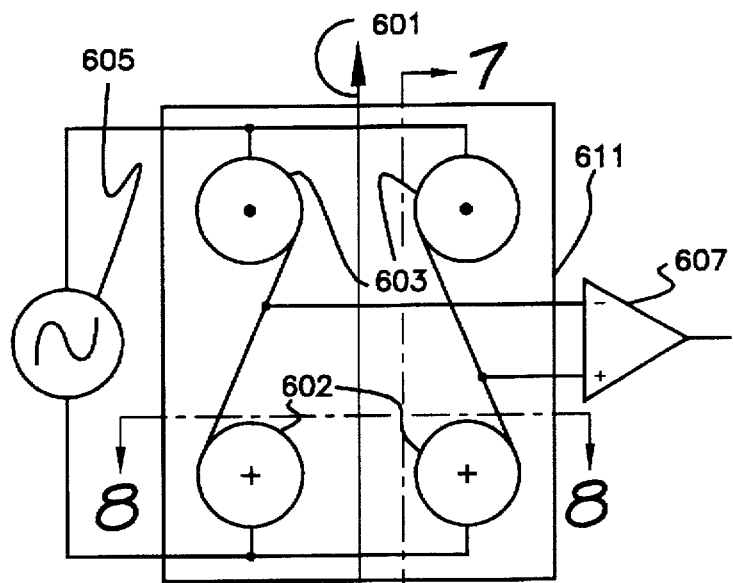
FIG. 6 depicts a diagrammatic plan view of a third embodiment of the present invention which includes a trough for placement of a current carrying wire.

FIG. 1 depicts a schematic representation of a first embodiment of the invention. As depicted, two coils 2 and 3 of are located on opposite sides of a current carrying line 1. The coils are wound in opposite directions. The current withing line 1 creates a magnetic field about the line. The field can be described in terms of magnetic induction which is a vector quantity that is used as a quantitative measure of a magnetic field. The magnetic field can be represented in magnitude and direction by magnetic flux lines. The magnetic flux of the current within wire 1 has a direction as indicated by arrow 8. A change in the magnetic flux of a magnetic field magnetizes a body brought within the magnetic field. When coils 2 and 3 are brought within the magnetic field and a change in magnetic flux occurs, a voltage (not shown) and current 4 are induced within the coils. The direction of the current is defined by the direction the coils are wound in. Coils 2 and 3 are on opposite sides of the line I and are wound in opposite directions, therefore, the induced current 4 is in opposite directions.

In addition to current, there is the component of electrical and magnetic noise (hereinafter referred to as noise). Noise is the interfering and unwanted current or voltages in an electrical system. When depicted as a current, noise includes a direction. Noise may mask or distort signals carried within the system. The present invention is engineered to eliminate a substantial portion of noise from the detection of current. Noise is generally classified into two broad categories, random and non-random, depending on the noise source. Random noise is not predictable and has a variety of sources including transistors and other semiconductor devices as well as electrical disturbances in the atmosphere. Non-random noise usually results from radiation picked up from other electrical equipment coupled to a system. The present invention addresses random noise generated by: the induction of current within the coils and background radiation. The induction of current within the windings generates a current noise as indicated by arrows 5. Background radiation is responsible for current noise as indicated by arrow 6. The direction of the noise components is the same in both windings.

The output of the current windings is directed to a differential amplifier 7. A differential amplifier amplifies the difference between inputted signals. As applied herein, the differential amplifier will amplify the difference between the current induced within coils 2 and 3. The current within the coils generated by the current within wire 1 is in opposite directions, therefore, when amplifying the difference, differential amplifier 7 will output a signal that adds the coils output. Mathematically, this can be envisioned as a first numeral minus a negative second numeral (a−(−a)=a+a). Regarding the noise component, the noise is in the same direction in both coils and has the same relative value. Therefore, when the difference of the noise components is amplified by amplifier 7, the noise component will fall out. Mathematically, this can be envisioned as the subtraction of two like numerals (a−a). As a result, the output of the differential amplifier will be proportional to the current within wire 1.

FIG. 2 is a schematic of a second embodiment of the invention. As depicted, two windings 202 and 203 of opposite directions are placed axially and laterally on opposite sides of a current carrying line 201. As depicted, the windings are arranged in an bridge circuit. A bridge circuit is an electrical network composed of four impedances forming a diamond shaped network. As used by the present invention, the impedances are coils 202 and 203. By this arrangement, windings on opposing sides of the current carrying line 201 are electrically connected to produce an output. An excitation signal is provided by signal source 205. The excitation signal matches the frequency amplitude of the current to be measured thereby facilitating detection of the current. Therefore, when a current runs through line 201, the resulting magnetic flux 208 induces a voltage 212, due to excitation 205, within the windings. The output of the windings are directed to a differential amplifier 207. The structure of the windings leading to like polarity comprise a substantial overlap in windings so as to capture magnetic flux from the current carrying line. Like polarity windings are fed into the same input of the differential amplifier by way of the bridge circuit arrangement. As a result of the operation of the differential amplifier, taking the difference of the input signal, noise 210 and terrestrial noise 211 will cancel leaving a signal that's only a function of or related to the current in line 201. Although depicted as a bridge circuit arrangement with windings, any type of circuit arrangement may be appropriate as envisioned by one skilled in the art, for example a bridge circuit using Hall Effect devices in place of windings. The Hall Effect refers to the change of a component's electrical conduction caused by a magnetic field vector applied normal to the current density vector. The result is a change in the component's electrical field.

FIG. 3 depicts a diagrammatic plan view of the second embodiment of the present invention. As shown, windings 202 and 203 are electrically connected to an differential amplifier 207 by means of a bridge circuit. An excitation source 205 powers the windings. The windings, differential amplifier and excitation source are housed within an insulated housing 200. The insulated housing 200 includes a bend running the length of same at the approximate midpoint (not shown). The insulated housing is composed of a material that is non-conductive as would be imagined by one skilled in the art. The current carrying wire 201 is accommodated within said bend during measuring procedure. The placement of wire 201 within the bend brings the current carried therein to a sufficient proximate distance thereby facilitating the magnetic flux of said current to induce a voltage within the windings as discussed above. Because the windings are brought close to the wire, the wire does not need to be cut nor relocated except to facilitated placement of the wire within the bend. The size of the present invention is relatively small. Therefore, where possible the apparatus can be held to or placed on the current carrying wire.

FIG. 4 depicts a diagrammatic side elevational view along line 4—4 of the second embodiment of the present invention. FIG. 5 depicts a diagrammatic end elevational view along one 5—5 of the second embodiment of the present invention. As depicted a bend 212 is placed at the proximate midline of the insulated housing 200. Bend 212 accommodates a current carrying wire 213 therein. As clearly shown in FIG. 5, housing 200 comprises essentially flat members 204 and 206 arranged at an obtuse angle and joined at bend 212 to describe a shallow V-shaped configuration. The interior of the V-shaped configuration forms a recess 215 for receiving wire 213. The overall width of housing 200, taken from right to left as depicted in FIG. 5, exceeds a corresponding thickness taken vertically from top to bottom, as indicated by arrow 214, by at least a factor of three. Also, it will be seen that the depth of recess 215, depth being taken in a direction parallel to the thickness, is equal in magnitude to at least half of the overall thickness of housing 200.

Figure 7:
FIG. 7 depicts a diagrammatic side elevational view along line 7—7 of FIG. 6 of the present invention.
Figure 8:
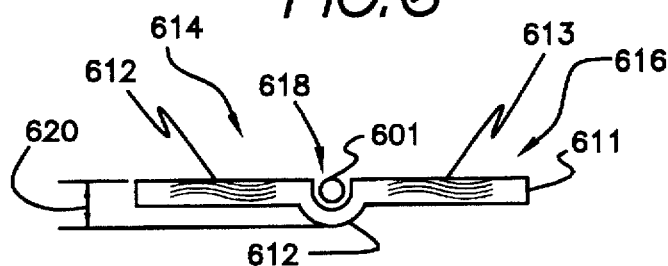
FIG. 8 depicts a diagrammatic side elevational view along line 8—8 of FIG. 6 of the present invention.

FIG. 6 depicts a diagrammatic side elevational view of a third embodiment of the present invention. As shown, two sets of coil windings are positioned in a first and second part of an insulated housing. A first set of coil windings 603 are of similar direction and are positioned on opposite sides of a current carrying wire 601 so as to have current induced by the magnetic field of the current carrying wire. The first set of coil windings 603 are in a bridge circuit arrangement with the second set of coil windings 602. Like the first set of coil windings, the second set is displaced on either side and proximate to the current carrying wire 601 so as to facilitate a current induced within the first and second set of windings 602 and 603 by the magnetic flux of wire 601. An excitation source 605 is provided in electrical connection with the bridge circuit so as to provide a signal to the bridge circuit of similar frequency amplitude to the current within wire 601. A differential amplifier 607 is electrically connected with the bridge circuit so as to detect the signal generated within the bridge circuit. Finally, both sets of coil windings, excitation source and differential amplifier are housing in an insulated housing 611. FIG. 7 depicts the structure of FIG. 6 along line 7—7. FIG. 8 depicts the structure of FIG. 6 as defined along line 8—8. As depicted, housing 611 further incudes a circular bend 612 within which current carrying wire 601 may be positioned. The bend 612 is positioned in housing 611 so as to bring the current carrying wire 601 proximate to the two sets of windings in order to facilitate the induction of a current therein. Housing 611 comprises two members 614, 616 joined at bend 612. Surfaces 612, 613 of housing 611 are essentially coplanar. Bend 612 forms a recess 618 at the interior thereof. Recess 618 is concave relative surfaces 612 and 613. In a manner similar to that of the embodiment of FIG. 5, the depth of recess 618, depth being taken in a direction parallel to the thickness, is equal in magnitude to at least half of the overall thickness, indicated by arrow 620, of housing 611. The proportion of width, as measured from left to right in FIG. 8, exceeds that of the thickness by at least a factor of three.

Figure 9:
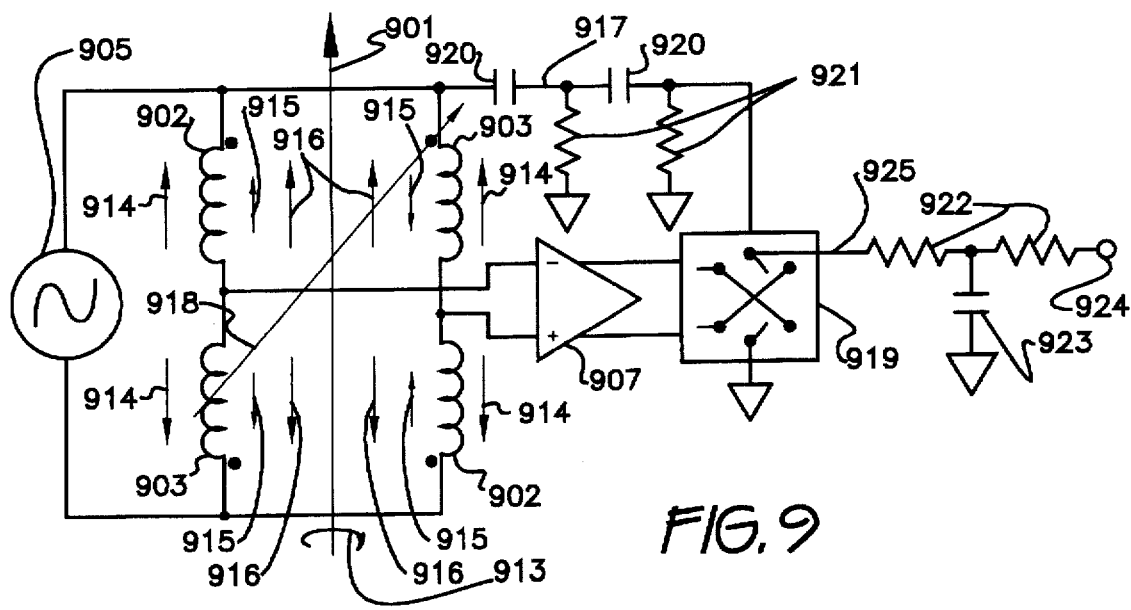
FIG. 9 depicts an electrical schematic view of a fourth embodiment of the present invention which includes a bend for accommodating a current carrying wire.

FIG. 9 depicts an electrical schematic of a fourth embodiment of the present invention. The fourth embodiment measures AC current that flows through a wire. As shown, two sets of two windings oppose a current carrying wire 901. The first set of windings 902 diagonally oppose one another and are of the same winding direction. The second set of windings 903 diagonally oppose one another and are of the same winding direction. The current carrying wire generates a magnetic flux as indicated by arrow 913. The magnetic flux and an excitation signal 905 induce a voltage within both sets of windings as indicated by arrows 914. A current is induced in each coil in the direction of arrows 915. Furthermore, noise is generated by the current in wire 901 as indicated by arrows 916 and terrestrial noise is indicated by arrow 918. An excitation signal which is modulated to the frequency of the alternating current flowing within wire 901 is provided to the bridge circuit by an excitation signal source 905. The current generated within the coils are fed into differential amplifier 907. The noise components drop out as explained above. The output of the differential amplifier is fed into a rectifier 919. In addition, output from the bridge circuit is fed into rectifier 919 though conductor 917. Conductor 917 includes two capacitors 920 and grounded resistors 921. The rectifier demodulates the input signals to provide an output signal to conductor 925 that represents the AC modulated signal current carded within wire 901. Conductor 925 carries the rectifier output signal via two resistors 922 and a grounded capacitor 923 to node 924. Node 924 provides a point for measuring of the rectifier output signal.

Figure 10:
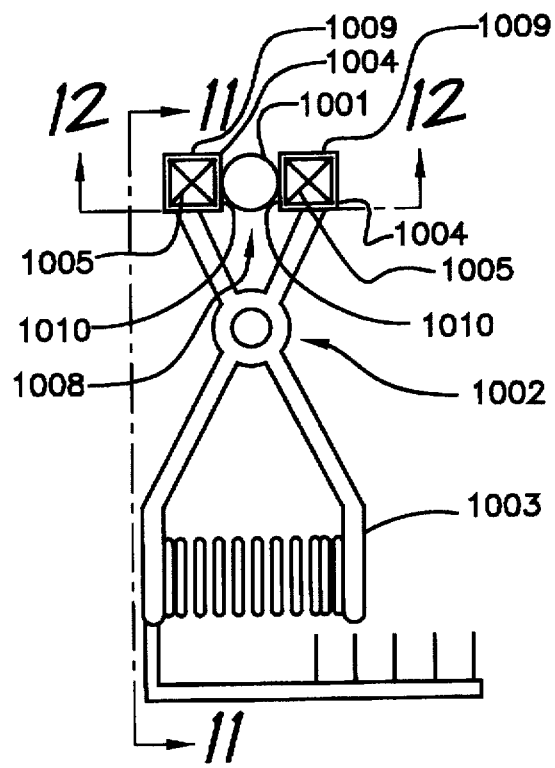
FIG. 10 depicts a diagrammatic plan view of a fifth embodiment of the present invention which includes additional elements for sensing alternating current.
Figure 12:
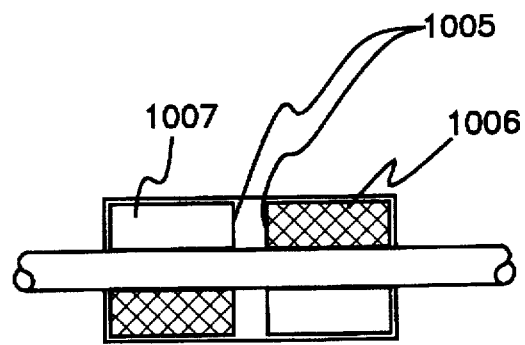
FIG. 12 depicts a top diagrammatic plan view of FIG. 10 of the present invention.
Figure 11:
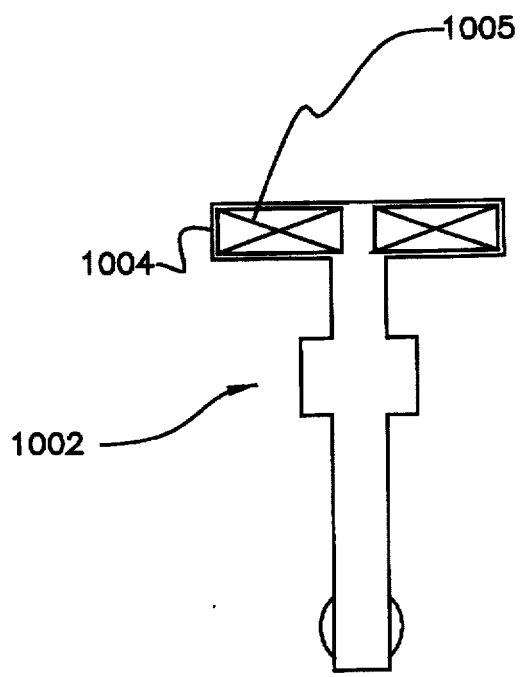
FIG. 11 depicts a side diagrammatic side elevational view of FIG. 10 of the present invention.

A fourth embodiment of the present invention is depicted in FIG. 10. As shown, a current carrying wire 1001 is gripped by a clamp meter 1002. A bottom portion of the clamp 1003 is for gripping by the user. When manually brought together the bottom ends of the clamp bring upper portions 1004 together. The width of an object, such as a wire, placed between the upper portions can be measured by determining the length moved by the lower portion 1003 when the upper portions grip the wire. The clamp acts like a vernier gauge in measuring the width of the wire. The function of the upper portions 1004 is to bring blocks 1005 close to the wire. Blocks 1005 represent the bridge circuitry discussed above for detection of current within a wire. The clamp 1002 brings the windings of the bridge circuit close enough to the wire so that the magnetic flux of the current within the wire can induce a current within the windings. Upper portions 1004 each have a distal surface 1009 and opposing surfaces 1010. Distal surfaces 1009 are generally coplanar. Opposing surfaces 1010 are spaced apart to accommodate wire 1001. A recess 1008 for receiving wire 1008 is defined between surfaces 1010. FIG. 11 depicts clamp 1002 along line 11—11. FIG. 12 depicts clamp 1002 along line 12—12, wherein windings 1006 and 1007 are represented.

It is to be understood that the provided illustrative examples are by no means exhaustive of the many possible uses of the invention. From the foregoing description, one skilled in the art can easily ascertain the essential characteristics of this invention and, without departing from the sprit and scope thereof, can make carious changes and modifications of the invention to adapt it to various usages and conditions. For example, the artisan could construct the present invention use Hall Effect elements in place of coil windings. It is to be understood therefore that the present invention is not limited to the sole embodiment described above, but encompasses any and all embodiments within the scope of the following claims.

What is claimed is:

1. A current measuring apparatus for measuring current in a wire comprising:

a voltage source having a first terminal and a second terminal, a differential amplifier having a first input and a second input, a housing having a first portion, a second portion, a recess for receiving the wire being measured for current defined between said first portion and said second portion, a width, and a thickness, said width exceeding said thickness in magnitude by at least a factor of three;

an electrical circuit disposed within the housing such that the wire carrying current may be monitored for current by said electrical circuit by sensing magnetic fields generated by the current, wherein said electrical circuit comprises a first magnetic field sensing element having a first end and a second end, a second magnetic field sensing element having a first end and a second end, a third magnetic field sensing element having a first end and a second end, and a fourth magnetic field sensing element having a first end and a second end, a first voltage node, a second voltage node, a third voltage node, and a fourth voltage node;

said first end of said first magnetic field sensing element, said first end of said second magnetic field sensing element, and said first input of said differential amplifier being connected at said first voltage node;

said first end of said third magnetic field sensing element, said first end of said fourth magnetic field sensing element, and said second input of said differential amplifier being connected at said second voltage node, said second end of said first magnetic field sensing element, said second end of said third magnetic field sensing element, and said first terminal of said voltage source being connected at said third voltage node; and said second end of said second magnetic field sensing element, said second end of said fourth magnetic field sensing element, and said second terminal of said voltage source being connected at said fourth voltage node; and wherein said first end of said first magnetic field sensing element and said second end of said second magnetic field sensing element generate currents of opposite signs in response to a magnetic flux;

said first magnetic field sensing element and said second magnetic field sensing element being located in said first portion of said housing, and said third magnetic field sensing element and said fourth magnetic field sensing element being located in said second portion of said housing.

2. A current measuring apparatus for measuring current in a wire according to claim 1, wherein said recess is round.

3. A current measuring apparatus for measuring current in a wire according to claim 1, wherein said housing comprises two flat members and a bend, said flat members arranged at an obtuse angle and joined at said bend, said housing describing a shallow V-shaped configuration.

4. A current measuring apparatus for measuring current in a wire according to claim 1, wherein said at least one said magnetic field sensing element comprises a coreless winding.

5. A current measuring apparatus for measuring current in a wire according to claim 1, wherein said first magnetic field sensing element and said third field magnetic sensing element comprise coreless windings wound in one direction and said second magnetic field sensing element and said fourth magnetic field sensing elements comprise coreless windings wound in another direction.

6. A current measuring apparatus for measuring current in a wire according to claim 1, wherein said first magnetic field sensing element, said second magnetic field sensing element, said third magnetic field sensing element, and said fourth magnetic field sensing element comprise Hall effect devices.

7. The current measuring apparatus for measuring current in a wire according to claim 1, wherein said housing is made of an electrically insulating material.

* * * * *